United States Patent
Rouh et al.

(10) Patent No.: US 7,511,337 B2
(45) Date of Patent: Mar. 31, 2009

(54) RECESS GATE TYPE TRANSISTOR

(75) Inventors: Kyoung Bong Rouh, Goyang-si (KR); Seung Woo Jin, Icheon-si (KR); Min Yong Lee, Seoul (KR); Yong Soo Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 85 days.

(21) Appl. No.: 11/501,943

(22) Filed: Aug. 10, 2006

(65) Prior Publication Data

US 2007/0152267 A1 Jul. 5, 2007

(30) Foreign Application Priority Data

Dec. 29, 2005 (KR) .................. 10-2005-134296

(51) Int. Cl.
*H01L 29/76* (2006.01)
(52) U.S. Cl. ............... 257/330; 257/334; 257/E29.201
(58) Field of Classification Search ......... 257/330–334, 257/E29.201, E29.257; 438/259, 258
See application file for complete search history.

(56) References Cited

U.S. PATENT DOCUMENTS

| | | | |
|---|---|---|---|
| 5,854,501 A * | 12/1998 | Kao | ............... 257/316 |
| 6,236,082 B1 * | 5/2001 | Kalnitsky et al. | ........... 257/315 |
| 2001/0031534 A1 | 10/2001 | Ahn et al. | ............... 438/268 |
| 2004/0259311 A1 * | 12/2004 | Kim | ................ 438/259 |
| 2006/0091482 A1 * | 5/2006 | Kim et al. | ............... 257/401 |

FOREIGN PATENT DOCUMENTS

| KR | 1997-0072477 | 11/1997 |
|---|---|---|
| KR | 2002-0037522 | 5/2002 |
| KR | 2004-0025242 | 3/2004 |

* cited by examiner

*Primary Examiner*—Tuan N. Quach
(74) *Attorney, Agent, or Firm*—Marshall, Gerstein & Borun LLP

(57) ABSTRACT

A semiconductor device having recess gates and a method for fabricating the same. The semiconductor device includes a semiconductor substrate having inverse triangular recesses formed therein; a gate insulating film having a designated thickness formed on the semiconductor substrate; gate electrodes formed on the gate insulating film so that the gate electrodes fill the inverse triangular recesses and protrude from the surface of the semiconductor substrate; and first and second junction regions formed in the semiconductor substrate and opposed to each other so that the corresponding one of the gate electrodes is interposed therebetween.

3 Claims, 5 Drawing Sheets

RECESS GATE TYPE TRANSISTOR

BACKGROUND OF THE INVENTION

1. Field of the Invention

The invention relates to a semiconductor device, and more particularly to a recess gate type transistor, which increases saturation current, and a method for fabricating the same.

2. Description of the Related Art

As semiconductor devices are highly integrated, widths of gates are gradually decreased and formation of high-density junctions and channels is required. However, intervals of channels are decreased and electric fields applied to sources and drains are gradually increased. The increased electric fields accelerate electrons between the sources and the drains and generate hot carriers, which damage to the surfaces of the gates, thus causing degradation of the semiconductor device.

Particularly, in cells, since the increase of the electric fields generates a leakage current, it is difficult to refresh the cells. Accordingly, in order to improve refresh characteristics, a recess gate type transistor is used instead of a planar gate type transistor having gate electrodes formed on the plan surface of a substrate. Such a recess gate type transistor is structured in that a gate insulating film is formed on side walls and bottom surfaces of recesses formed in a substrate and the recesses are filled with a conductive film, such as a polysilicon film. The recess gate type transistor improves refresh characteristics and reduces the generation of hot carriers and the generation of punch through, but still has an increased length of channels.

When the channel length is increased, a saturation current (Idsat) decreases, thus causing difficulty in fabricating a high-speed semiconductor device.

In order to fabricate the recess gate type transistor, ion implantation for adjusting threshold voltage (Vt) is performed. However, in this case, the adjustment of the threshold voltage (Vt) may be limited. In order to solve the problem, in the ion implantation, ions are implanted at a designated tilt angle. However, it is difficult to implant ions at a designated tilt angle due to a shadow effect of recessed areas. Accordingly, general recess gates cannot use all channels.

FIG. 1 is a schematic, sectional view of a conventional recess gate type transistor.

With reference to FIG. 1, recesses 11 formed in a semiconductor substrate 10 have a general shape. Here, in order to adjust threshold voltage, ions are implanted into the recesses 11 at a right angle. When ions are implanted into the recesses 11 at the right angle, the ions are implanted into the bottom surfaces of the recesses 11, but are not implanted into the side surfaces of the recesses 11. Here, reference numeral 12 represents an anti-etching film.

Here, in order to adjust the threshold voltage, ions are implanted into the recesses 11 at a designated tilt angle. However, in this case, ion implanted areas of the side walls of the recesses 11 are still limited due to shadow effect. That is, sides of the recesses 11, in which a source or a drain is formed, are covered with a mask, and then ion implantation is performed so that a punch through margin only at the sides of the recesses 11 is assured. This method requires an additional step, thereby causing time and economic losses.

Accordingly, a semiconductor device for improving the above characteristics and a method for fabricating the same are required.

SUMMARY OF THE INVENTION

The invention provides a semiconductor device, which increases saturation current, and a method for manufacturing the same.

In accordance with one aspect, the invention provides a semiconductor device having recess gates including a semiconductor substrate having inverse triangular recesses formed therein; a gate insulating film having a designated thickness formed on the semiconductor substrate; gate electrodes formed on the gate insulating film so that the gate electrodes fill the inverse triangular recesses and protrude from the surface of the semiconductor substrate; and first and second junction regions formed in the semiconductor substrate and opposed to each other so that a corresponding one of the gate electrodes is interposed therebetween.

The inverse triangular recess may in one embodiment have one shape selected from the group consisting of an inverse triangle having three sides having different lengths, an inverse isosceles triangle, an inverse right-angle triangle, and an inverse equilateral triangle.

The gate electrodes may in one embodiment have a structure in that a gate conductive film and a gate metal film are sequentially stacked.

One of the first and second junction regions may in one embodiment be a source region, and the other of the first and second junction regions may be a drain region.

In accordance with a further aspect, the invention provides a semiconductor device having recess gates including a semiconductor substrate having inverse triangular recesses formed therein; first and second regions formed in the semiconductor substrate to have different heights and opposed to each other so that the corresponding one of the inverse triangular recesses is interposed therebetween; a gate insulating film having a designated thickness formed on the semiconductor substrate; gate electrodes formed on the gate insulating film so that the gate electrodes fill the inverse triangular recesses and protrude from the surface of the semiconductor substrate; and first and second junction regions formed at the first and second regions by ion implantation.

In accordance with another aspect, the invention provides a method for fabricating a semiconductor device having recess gates, including the steps of forming inverse triangular recesses by selectively etching the surface of a semiconductor substrate at a tilt; implanting ions into the inverse triangular recesses; forming a gate insulating film and gate electrodes filling the inverse triangular recesses on the surface of the semiconductor substrate exposed by the inverse triangular recesses; and forming first and second junctions, opposed to each other so that the corresponding one of the gate electrodes is interposed therebetween, in the semiconductor substrate.

The method may, in one embodiment further include performing a light etch treatment for rounding off angles of the recesses, after forming the inverse triangular recesses.

The implantation of the ions may in one embodiment include firstly implanting ions into the inverse triangular recesses for adjusting a threshold voltage; and secondly implanting ions into the inverse triangular recesses by count doping.

The ions may in one embodiment be implanted into all inner surfaces of the inverse triangular recesses at a tilt in the first implantation of the ions, and the ions may be implanted into one inner side surface of each of the inverse triangular recesses at a tilt in the second implantation of the ions.

In accordance with yet another aspect, the invention provides a method for fabricating a semiconductor device having recess gates, including the steps of forming inverse triangular recesses by selectively etching the surface of a semiconductor substrate at a tilt; forming first and second regions having different heights in the semiconductor substrate and opposed to each other so that the corresponding one of the inverse triangular recesses is interposed therebetween; implanting ions into the inverse triangular recesses; forming a gate insulating film and gate electrodes filling the inverse triangular recesses on the surface of the semiconductor substrate exposed by the inverse triangular recesses; and forming first and second junctions at the first and second regions.

In one embodiment, etching or epitaxial growth may be performed on the first and/or second regions in the step of forming the first and second regions having different heights.

In the semiconductor device having recess gates and the method for fabricating the same in accordance with the invention, characteristics of the semiconductor device may be improved, saturation current may be increased, and punch through margin may be improved.

BRIEF DESCRIPTION OF THE DRAWINGS

The invention will be more clearly understood from the following detailed description taken in conjunction with the accompanying drawings, in which.

DESCRIPTION OF THE PREFERRED EMBODIMENTS

Preferred embodiments of the invention will be described in detail with reference to the annexed drawings. The preferred embodiments may be variously modified, and do not limit the scope and spirit of the invention. The preferred embodiments have been disclosed for illustrative purposes to those skilled in the art, and the invention is defined only by the accompanying claims.

FIGS. 2 to 9 are schematic, sectional views illustrating a method for fabricating a recess gate type transistor in accordance with one embodiment of the invention.

Figure 1:
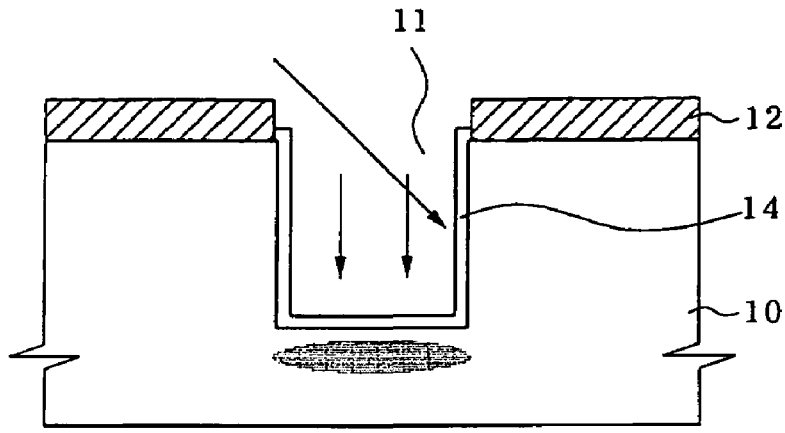
FIG. 1 is a schematic, sectional view of a conventional recess gate type transistor.
Figure 2:
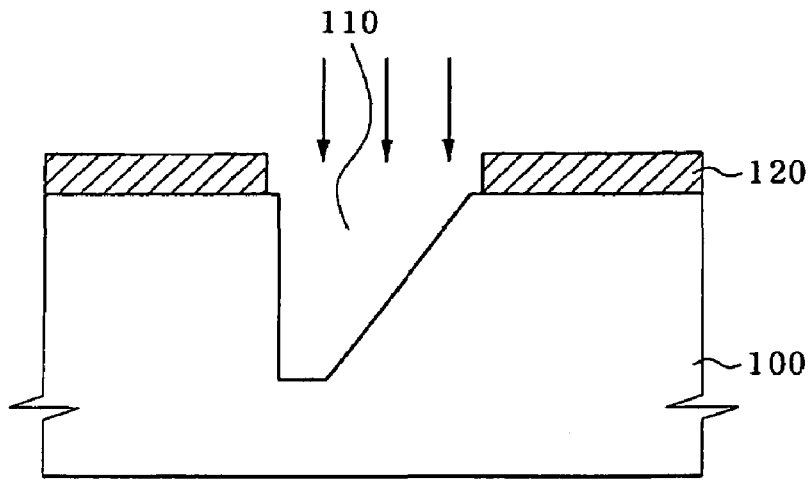
FIGS. 2 to 9 are schematic, sectional views illustrating a method for fabricating a recess gate type transistor in accordance with one embodiment of the invention.

With reference to FIG. 2, recesses 110 having an inverse triangular shape are formed in a semiconductor substrate 100 made of silicon by selectively etching the semiconductor substrate 100. That is, an anti-etching film 120 is formed on the semiconductor substrate 100, and the semiconductor substrate 100 is selectively etched so that the inverse triangular recesses 110 are formed in the semiconductor substrate 100. For example, as shown in FIG. 2, one of left (first sidewall) and right sides (second sidewall) of each of the recesses 110 may be etched through a tilt etching process.

Here, the recesses 110 are formed in a desired shape through the tilt etching process. That is, the inverse triangular recess 100 may be have a shape of an inverse triangle having three sides having different lengths, an inverse isosceles triangle, an inverse right-angle triangle, or an inverse equilateral triangle.

Figure 3:
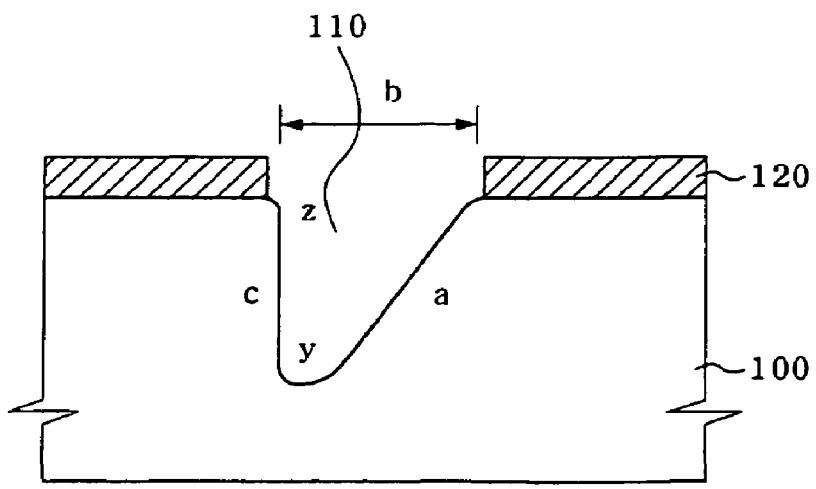

With reference to FIG. 3, in order to alleviate field crowding at the angles of the recesses 10, a light etch treatment (LET) for additionally etching the inverse triangular recesses 110 is performed, thereby rounding off the angles of the inverse triangular recess 110.

A channel length of the inverse triangular recesses 110 is easily obtained by a trigonometrical function, as follows.

$$a = c \sin Y, \text{ and}$$

$$c = b \tan Z$$

Here, a, b, and c represent three sides of the inverse triangular recess 110, Y represents an included angle between the side a and the side c, and Z represents a right angle. Thereby, a value of a+c, which denotes the channel length of the inverse triangular recesses 110, is obtained.

Figure 4:
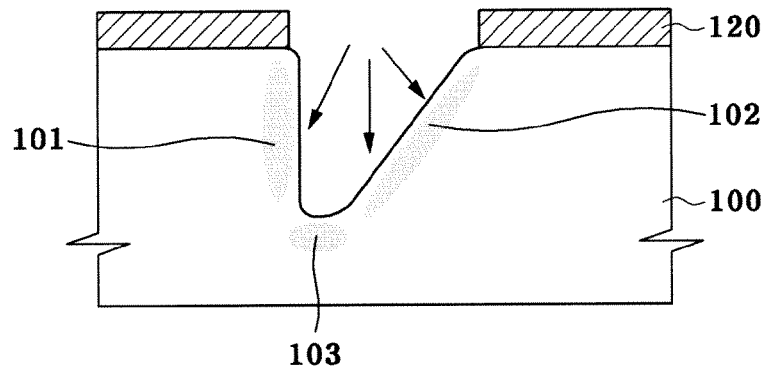

With reference to FIG. 4, first ion implantation for implanting ions into channel regions in the inverse triangular recesses 110 is performed. When ions for adjusting a threshold voltage (Vt) are implanted at a designated tilt angle, as shown by arrows in FIG. 4, the ions can be suitably implanted into all inner surfaces of the inverse triangular recesses 110. Then, a first impurity region 101 is located beneath the first sidewall, a second impurity region 102 is located beneath the second sidewall, and a third impurity region 103 is located beneath a bottom of the inverse triangular recesses 110 between the first and the second impurity regions. Accordingly, it is possible to sufficiently adjust the threshold voltage (Vt).

Figure 5:
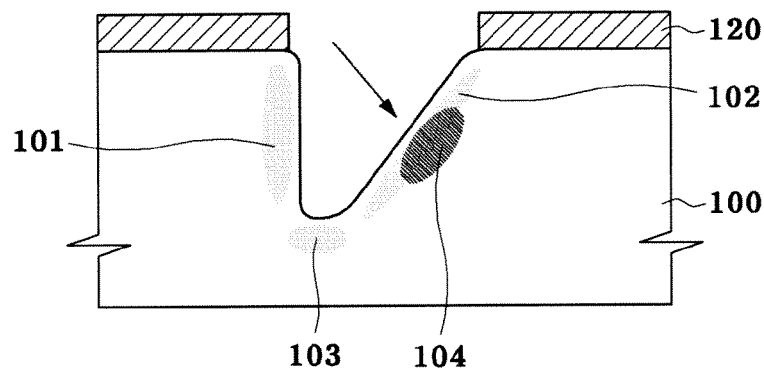

With reference to FIG. 5, second ion implantation for additionally implanting ions into the channel regions in the recesses 110 is performed. That is, in order to improve characteristics of a transistor, such as a punch through stop, a short channel effect, and a refresh characteristic, the second ion implantation is performed. Here, the ions are implanted into the side surfaces of the recesses 110 at a designated tilt angle. Then, a fourth impurity region 104 is located beneath the second sidewall and partially overlapped the second impurity region. Particularly, the ion implantation is performed by count doping so that the ions at a high dose and a high energy may be heavily implanted into the recesses 110 or the ions may be lightly implanted into the recesses 110.

In consideration of a source/drain junction, which will be formed later, a designated dose of the ions may be added to one side of each of the recesses 110, thus improving a punch through margin. Thereby, it is possible to assure a refresh margin without performing cell halo implantation.

Figure 6:
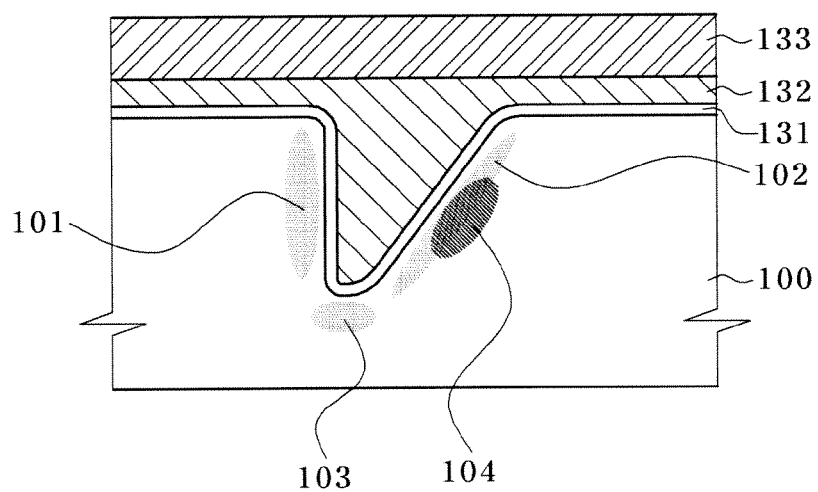

With reference to FIG. 6, after the ion implantation is completed, the anti-etching film 120 is removed from the semiconductor substrate 100, and a gate insulating film 131 is formed on the semiconductor substrate 100 exposed by the inverse triangular recesses 110. The gate insulating film 131 is made of an oxide film.

Thereafter, gate electrodes 130 (see FIG. 8) filling the inverse triangular recesses 110 are protruded from the surface of the semiconductor substrate 100. The gate electrodes 130 are obtained by sequentially forming a gate conductive film 132 and a gate metal film 133. Here, the gate conductive film 132 is illustratively made of a polysilicon film.

Figure 7:
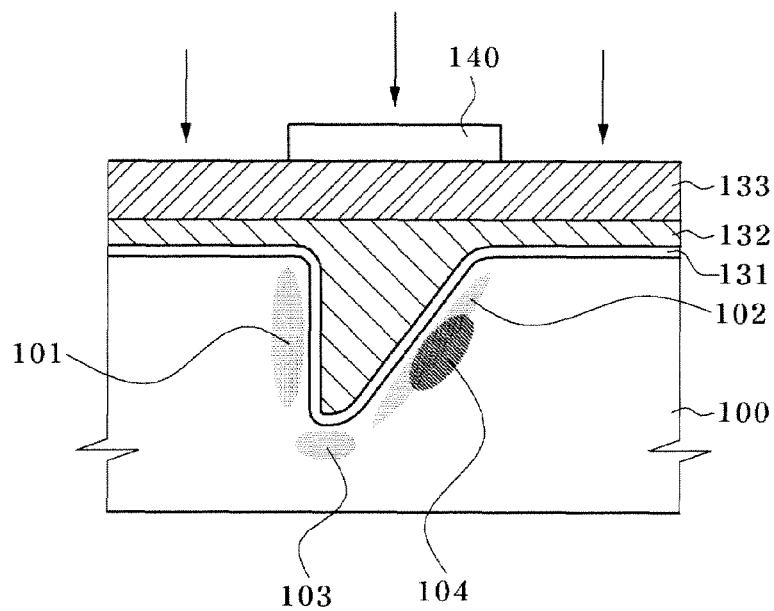

With reference to FIG. 7, a photoresist mask 140 is formed on the gate metal film 133 by selective etching. Thereby, the gate electrodes 130 are formed.

Figure 8:
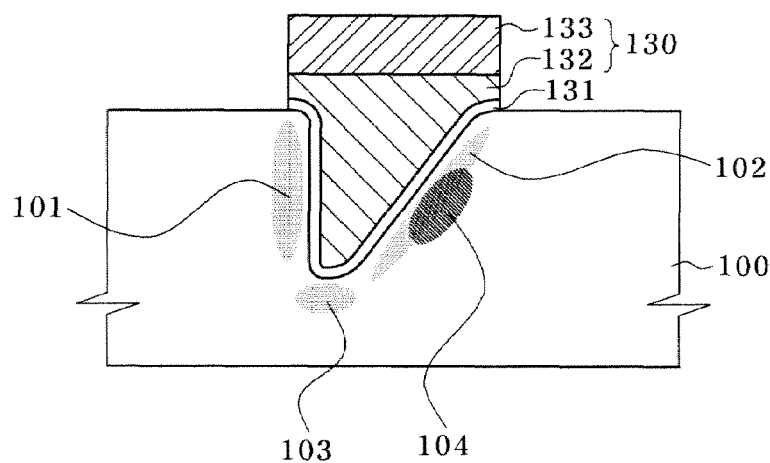

With reference to FIG. 8, the gate insulating film 131, the gate conductive film 132, and the gate metal film 133 are removed from regions of the semiconductor substrate 100, except for gate electrode regions, by etching using the photoresist mask 140.

Figure 9:
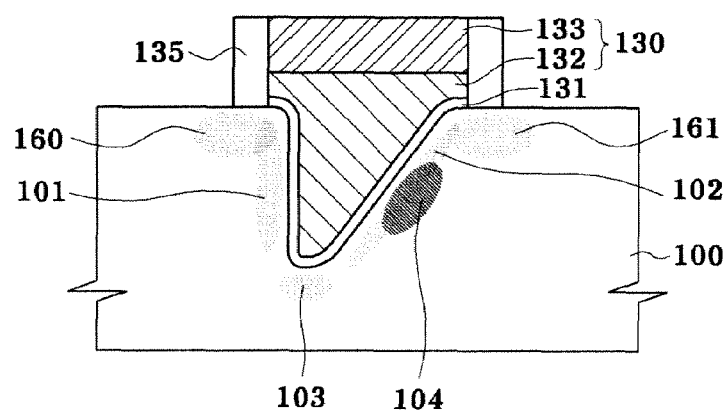

With reference to FIG. 9, spacers 135 are formed on side surfaces of the remaining gate insulating film 131, gate conductive film 132, and gate metal film 133.

Further, first and second junction regions 160 and 161 for forming sources and drains on regions of the semiconductor substrate 100 adjacent to the gates 130 are formed in the semiconductor substrate 100.

Here, ions are implanted into the semiconductor substrate 100 so that the first junction regions 160 form source regions and the second junction regions 161 form drain regions. Otherwise, ions may be implanted into the semiconductor substrate 100 so that the first junction regions 160 form drain regions and the second junction regions 161 form source regions.

The semiconductor device in accordance with this embodiment elongates the distance between the junctions, thus assuring a short channel margin so that a short channel effect is reduced. Further, since the channel length under the gates is increased and a high gate voltage is applied to channels, the semiconductor device in accordance with this embodiment has an effective channel length shorter than that of a recess channel structure and performs a high-speed operation, thus having a short response time.

The above matters are verified by the following equation regarding the saturation current.

$$\text{Idsat (saturation current)} = (W/2L) \times (T/\in)\mu \times (Vg-Vth)^2$$

In the foregoing equation, W represents channel width, L represents channel length, T represents temperature, $\in$ represents dielectric constant, $\mu$ represents carrier mobility, Vg represents gate voltage, and Vth represents threshold voltage. When the gate voltage is high, the saturation current is high and thus a switching speed is increased.

FIGS. 10 to 14 are schematic, sectional views illustrating a method for fabricating a recess gate type transistor in accordance with another embodiment of the invention.

Figure 10:
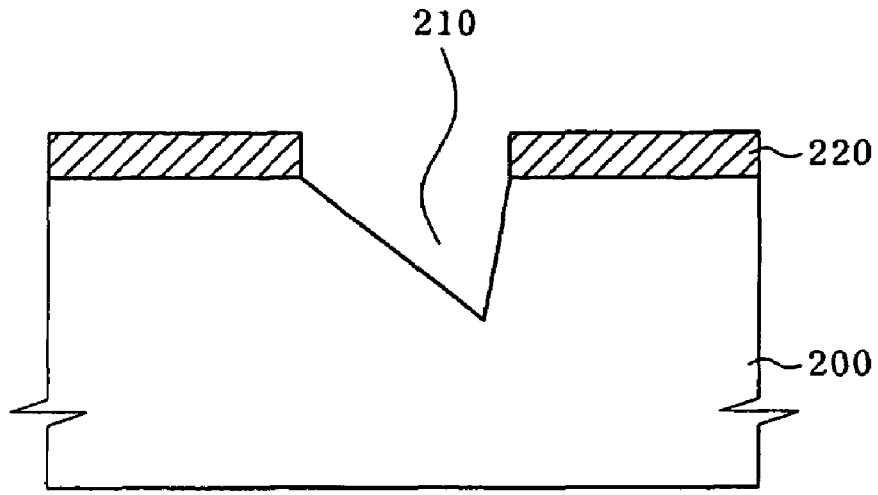
FIGS. 10 to 14 are schematic, sectional views illustrating a method for fabricating a recess gate type transistor in accordance with another embodiment of the invention.

With reference to FIG. 10, recesses 210 having an inverse triangular shape are formed in a semiconductor substrate 200, for example, a silicon substrate, by selectively etching the semiconductor substrate 100. That is, an anti-etching film 220 is formed on the semiconductor substrate 200, and the semiconductor substrate 200 is selectively etched so that the inverse triangular recesses 210 are formed in the semiconductor substrate 200. For example, as shown in FIG. 10, both left and right sides of the recesses 210 may be etched through a tilt etching process.

Here, the recesses 210 are formed in a desired shape through the tilt etching process. That is, the inverse triangular recesses 210 may be have a shape of an inverse triangle having three sides having different lengths, an inverse isosceles triangle, an inverse right-angle triangle, or an inverse equilateral triangle.

Figure 11:
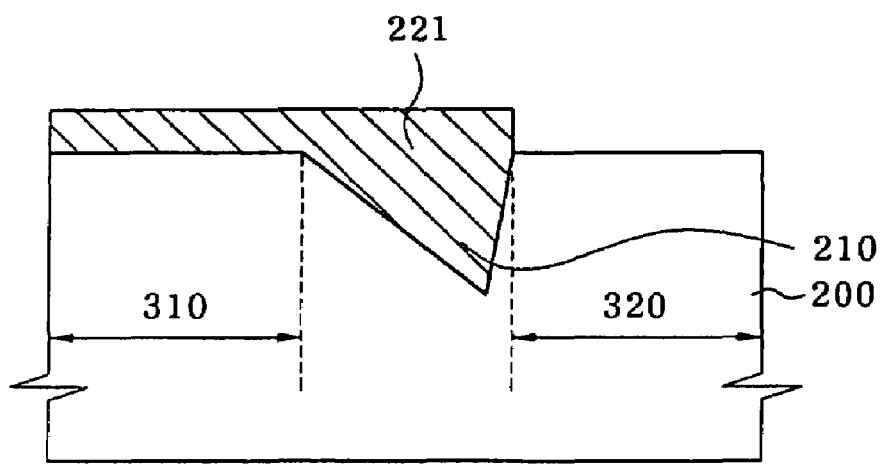

With reference to FIG. 11, in order to form a first region 310 and a second region 320, which are opposed to each other so that each of the inverse triangular recesses 210 is interposed therebetween, to have different heights, an anti-etching film 221 is formed on the inverse triangular recesses 210 and the first regions 310 or the second regions 320. In the embodiment shown in FIGS. 10 to 14, the anti-etching film 221 is formed on the inverse triangular recesses 210 and the first regions 310.

Figure 12:
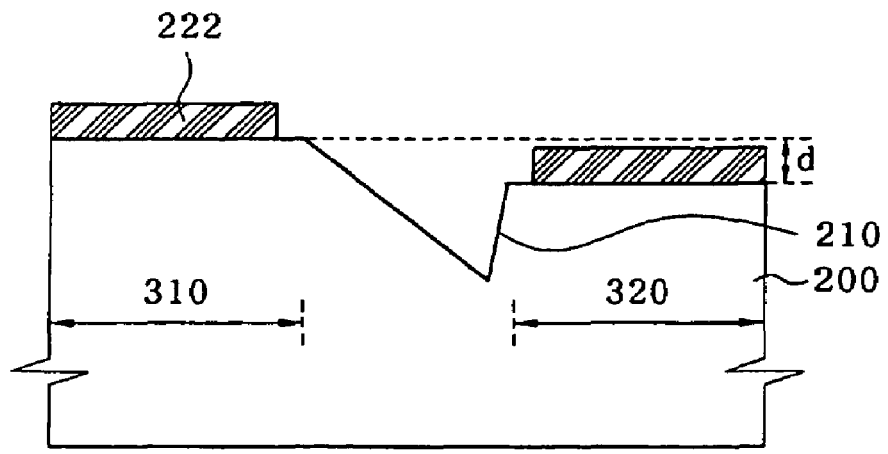

With reference to FIG. 12, there is a difference (d) of heights between the first regions 310 and the second regions 320.

In the embodiment shown in FIGS. 10 to 14, one region of the first region 310 and the second region 320 of each of the recesses 210 has a decreased height by etching so that the region has a lower height than that of the other region of the first region 310 and the second region 320. However, one region of the first region 310 and the second region 320 of each of the recesses 210 may have an increased height by epitaxial growth so that the region has a higher height than that of the other region of the first region 310 and the second region 320. Further, one region of the first region 310 and the second region 320 of each of the recesses 210 may have a decreased height by etching and the other region of the first region 310 and the second region 320 may have an increased height by epitaxial growth so that the regions have different heights. Further, both the first region 310 and the second region 320 of each of the recesses 210 may have decreased or increased heights by etching or epitaxial growth such that the decreased or increased heights of the first region 310 and the second region 320 differ from each other.

At this time, the shape of the inverse triangular recesses 210 is maintained. However, the shape of the inverse triangular recesses 210 maybe changed by the change of the heights of the first regions 310 and the second regions 320. For example, when the inverse triangular recesses 210 have a shape of an inverse isosceles triangle, the length of one side out of three sides of each of the inverse triangular recesses 210 is changed by the change of the height of the first region 310 or the second region 320. Thereby, the inverse triangular recess 210 has a shape of an inverse triangle having different lengths of three sides.

Subsequent steps of the method of this embodiment are the same as those of the method of the earlier embodiment.

In order to alleviate field crowding at the angles of the recesses 210, a light etch treatment (LET) for additionally etching the recesses 210 is performed, thereby rounding off the angles of the inverse triangular recesses 210.

First ion implantation for adjusting a threshold voltage (Vt) is performed. When ions are implanted into channel regions in the inverse triangular recesses 210 at a tilt, the ions can be suitably implanted into all inner surfaces of the inverse triangular recesses 210. Accordingly, it is possible to sufficiently adjust the threshold voltage (Vt).

Second ion implantation for improving characteristics of the transistor is performed. That is, in order to improve characteristics, such as a punch through stop, a short channel effect and a refresh characteristic, ions are implanted into the channel regions in the inverse triangular recesses 210. Here, the ions are implanted into one side surface of each of the recesses 210 at a tilt. Particularly, the ion implantation is performed by count doping so that the ions at a high dose and a high energy may be heavily implanted into the recesses 210 and the ions may be lightly implanted into the recesses 210.

In consideration of a source/drain junction, which will be formed later, a designated dose of the ions may be added to one side of each of the recesses 210, thus improving characteristics of the semiconductor device including a punch through margin. Thereby, it is possible to assure a refresh margin without performing cell halo implantation.

Figure 13:
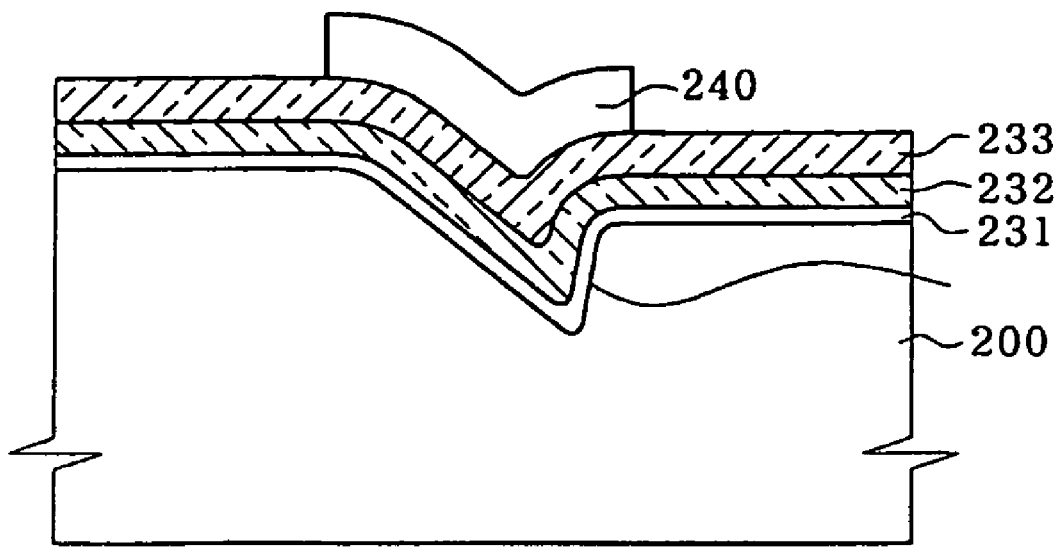

With reference to FIG. 13, after the ion implantation is completed, the anti-etching film 220 (FIG. 10) is removed from the semiconductor substrate 200, and a gate insulating film 231 is formed on the semiconductor substrate 200 exposed by the inverse triangular recesses 210. The gate insulating film 231 is made of an oxide film.

Thereafter, gate electrodes 230 (FIG. 14) filling the inverse triangular recesses 210 are protruded from the surface of the semiconductor substrate 200. The gate electrodes 230 are obtained by sequentially forming a gate conductive film 232 and a gate metal film 233. Here, the gate conductive film 232 is illustratively made of a polysilicon film.

Figure 14:
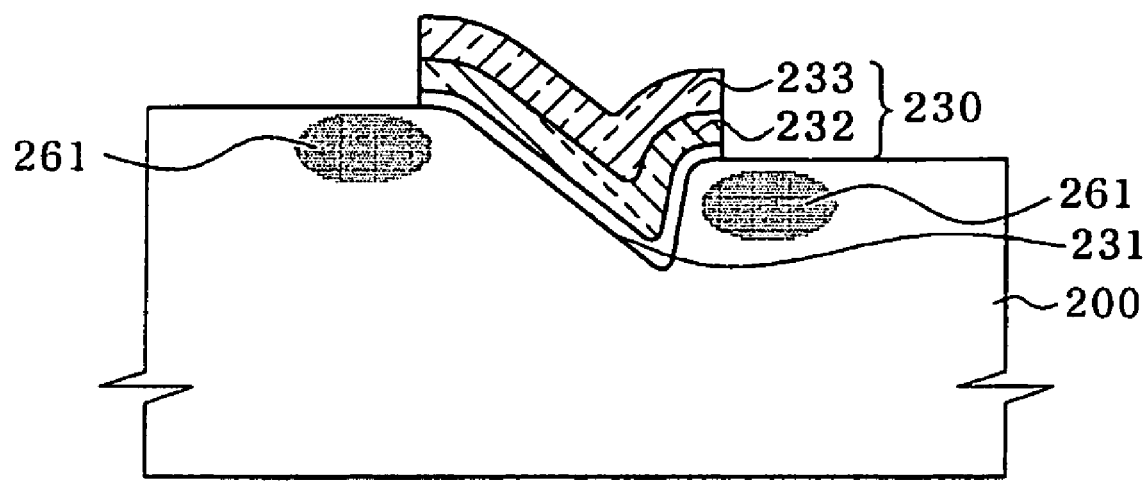

With reference to FIG. 14, a photoresist mask 240 is formed on the gate metal film 233 by selective etching. Thereby, the gate electrodes 230 are formed. That is, the gate insulating film 231, the gate conductive film 232, and the gate metal film 233 are removed from regions of the semiconductor substrate 200, except for gate electrode regions, by etching using the photoresist mask 240.

Spacers (not shown) are formed on side surfaces of the gate insulating film 231, the gate conductive film 232, and the gate metal film 233.

First and second junction regions 260 and 261 for forming sources and drains on regions of the semiconductor substrate 200 adjacent to the gate electrodes 230 are formed in the semiconductor substrate 200.

Here, ions are implanted into the semiconductor substrate 200 so that the first junction regions 260 form source regions and the second junction regions 261 form drain regions. Otherwise, ions may be implanted into the semiconductor substrate 200 so that the first junction regions 260 form drain regions and the second junction regions 261 form source regions.

The semiconductor device in accordance with this embodiment elongates the distance between the junctions, thus assuring a short channel margin so that a short channel effect is reduced. Further, since the channel length under the gates is increased and a high gate voltage is applied to channels, the semiconductor device in accordance with this embodiment has an effective channel length shorter than that of a recess channel structure and performs a high-speed operation, thus having a short response time.

As apparent from the foregoing description, the invention provides a semiconductor device having recess gates to improve characteristics and a method for fabricating the same.

The semiconductor device having inverse triangular recesses in accordance with the invention elongates a channel length compared to a planar gate type semiconductor device, thus improving a punch through margin. Further, the semiconductor device of the invention minimizes a shadow effect and allows ions to be implanted into a semiconductor substrate at a tilt so that a sufficient amount of ions can be implanted into the semiconductor substrate. That is, it is possible to stably adjust a threshold voltage.

In consideration of source or drain junctions, a designated dose of the ions may be added to one side of each of the recesses, thus improving the punch through margin. Thereby, it is possible to assure a refresh margin without performing cell halo implantation.

A channel length under the gates is elongated and a gate voltage is increased, thus improving saturation current.

Since switching speed is increased using the improved saturation Current, the semiconductor device of the invention can be applied to a dynamic random access memory (DRAM).

Although the preferred embodiments of the invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device having recess gates comprising:
a semiconductor substrate having a surface;
an inverse, asymmetric triangular recess trench formed in the semiconductor substrate, the inverse triangular recess trench having a first sidewall and a second sidewall, the first sidewall being perpendicular to the surface of the semiconductor substrate and the second sidewall being sloped with respect to the surface of the semiconductor substrate;
a gate insulating film having a designated thickness formed on an exposed side of the inverse triangular recess trench;
a gate conductive film and a gate metal film sequentially formed on the gate insulating film so that the gate conductive film and the gate metal film fill the inverse triangular recesses and protrude from the surface of the semiconductor substrate;
first and second junction regions formed in the semiconductor substrate and opposed to each other so that a channel is located along the first sidewall and the second sidewall; and,
a first impurity region located beneath the first sidewall, a second impurity region located beneath the second sidewall, and a third impurity region located beneath a bottom of the inverse triangular recess trench between the first and the second impurity regions so that the first impurity region, the second impurity region, and the third impurity region adjust threshold voltage.

2. The semiconductor device of claim 1, wherein one of the first and second junction regions is a source region and the other of the first and second junction regions is a drain region.

3. The semiconductor device of claim 1, wherein the inverse triangular recess trench further comprises a fourth impurity region, the fourth impurity region being located beneath the second sidewall and partially overlapped the second impurity region.

* * * * *